United States Patent
Daimon

(10) Patent No.: US 10,418,970 B2
(45) Date of Patent: Sep. 17, 2019

(54) ELASTIC WAVE DEVICE AND LADDER FILTER

(71) Applicant: Murata Manufacturing Co., Ltd., Nagaokakyo-shi, Kyoto-fu (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 265 days.

(21) Appl. No.: 15/359,660

(22) Filed: Nov. 23, 2016

(65) Prior Publication Data

US 2017/0077902 A1    Mar. 16, 2017

Related U.S. Application Data

(63) Continuation of application No. PCT/JP2015/064772, filed on May 22, 2015.

(30) Foreign Application Priority Data

May 26, 2014    (JP) .............................. 2014-108113

(51) Int. Cl.
*H03H 9/64* (2006.01)
*H03H 9/25* (2006.01)
(Continued)

(52) U.S. Cl.
CPC ...... *H03H 9/6489* (2013.01); *H03H 9/02858* (2013.01); *H03H 9/1457* (2013.01);
(Continued)

(58) Field of Classification Search
CPC ........... H03H 9/02858; H03H 9/02881; H03H 9/14517; H03H 9/14532; H03H 9/1457;
(Continued)

(56) References Cited

U.S. PATENT DOCUMENTS 7,170,372 B2 * 1/2007 Ruile ................. H03H 9/02992
                                                310/313 C
7,449,812 B2 * 11/2008 Hauser ............... H03H 9/14517
                                                310/313 B
(Continued)

FOREIGN PATENT DOCUMENTS

JP    2000-183681 A    6/2000
JP    2007-19710 A    1/2007
(Continued)

OTHER PUBLICATIONS

English language machine translation of JP 2000-183681 A, published Jun. 30, 2000, 4 pages.*
(Continued)

*Primary Examiner* — Barbara Summons
(74) *Attorney, Agent, or Firm* — Keating & Bennett, LLP

(57) ABSTRACT

An elastic wave device includes an IDT electrode including first electrode fingers and second electrode fingers. In an intersecting portion, in which the first electrode fingers and the second electrode fingers interdigitate with each other, low-acoustic-velocity regions are disposed on both sides of a central region, high-acoustic-velocity regions are disposed outside of the low-acoustic-velocity regions, and the dimension of each of the low-acoustic-velocity regions in the electrode finger direction is not uniform in the elastic-wave propagation direction.

20 Claims, 7 Drawing Sheets

(51) Int. Cl.
*H03H 9/02* (2006.01)
*H03H 9/145* (2006.01)

(52) U.S. Cl.
CPC .......... *H03H 9/14532* (2013.01); *H03H 9/25* (2013.01); *H03H 9/6483* (2013.01); *H03H 9/6496* (2013.01)

(58) Field of Classification Search
CPC .. H03H 9/14576; H03H 9/14579; H03H 9/25; H03H 9/6423; H03H 9/6483; H03H 9/6489; H03H 9/6496
USPC .................................................. 333/193–196
See application file for complete search history.

(56) References Cited

U.S. PATENT DOCUMENTS

| | | | |
|---|---|---|---|
| 7,576,471 | B1 | 8/2009 | Solal |
| 7,965,155 | B2* | 6/2011 | Nakamura ......... H03H 9/02858 310/313 B |
| 10,009,003 | B2* | 6/2018 | Araki ................. H03H 9/02535 |
| 2007/0008052 | A1 | 1/2007 | Wada et al. |
| 2008/0309192 | A1 | 12/2008 | Nakao et al. |
| 2010/0194496 | A1 | 8/2010 | Goto et al. |
| 2011/0068655 | A1 | 3/2011 | Solal et al. |
| 2012/0161577 | A1* | 6/2012 | Abbott ............... H03H 9/02858 310/313 C |
| 2013/0051588 | A1* | 2/2013 | Ruile ....................... H03H 3/08 381/190 |

FOREIGN PATENT DOCUMENTS

| | | | |
|---|---|---|---|
| JP | 2010-166148 A | * | 7/2010 |
| JP | 2010-251889 A | | 11/2010 |
| JP | 2012-186808 A | | 9/2012 |
| JP | 2012-253738 A | * | 12/2012 |
| WO | 2007/108269 A1 | | 9/2007 |
| WO | 2011/088904 A1 | | 7/2011 |

OTHER PUBLICATIONS

English language machine translation of JP 2012-253738 A, published Dec. 20, 2012, 12 pages.*
English language machine translation of JP 2010-166148 A, published Jul. 29, 2010, 8 pages.*
Official Communication issued in corresponding International Application PCT/JP2015/064772, dated Jul. 7, 2015.

* cited by examiner

ELASTIC WAVE DEVICE AND LADDER FILTER

CROSS REFERENCE TO RELATED APPLICATIONS

This application claims the benefit of priority to Japanese Patent Application No. 2014-108113 filed on May 26, 2014 and is a Continuation Application of PCT Application No. PCT/JP2015/064772 filed on May 22, 2015. The entire contents of this application are hereby incorporated herein by reference.

BACKGROUND OF THE INVENTION

1. Field of the Invention

The present invention relates to an elastic wave device with a structure that suppresses transverse modes by using a piston mode and to a ladder filter including the elastic wave device.

2. Description of the Related Art

Elastic wave devices that use a piston mode to suppress transverse modes have been proposed. WO 2011/088904A1 describes a device in which each of electrode fingers of an interdigital transducer (IDT) electrode has a large-width region at an end thereof. Thus, low-acoustic-velocity regions are disposed on both sides of a central region in a direction in which the electrode fingers extend. High-acoustic-velocity regions are disposed outside of the low-acoustic-velocity regions. WO 2011/088904A1 also describes a method of forming a low-acoustic-velocity region by using a structure in which end portions of electrode fingers are stacked on a dielectric layer.

However, with exiting elastic wave devices using a piston mode, such as the device described in WO 2011/088904A1, it is difficult to sufficiently suppress all transverse modes.

SUMMARY OF THE INVENTION

Preferred embodiments of the present invention is to provide an elastic wave device that more effectively suppresses or prevents transverse modes.

According to a preferred embodiment of the present invention, an elastic wave device includes a piezoelectric substrate, and an IDT electrode disposed on the piezoelectric substrate. The IDT electrode includes a plurality of first electrode fingers and a plurality of second electrode fingers that interdigitate with each other. In an intersecting portion, which is a region in which the first electrode fingers and the second electrode fingers overlap in an elastic-wave propagation direction, low-acoustic-velocity regions are disposed on both sides of a central region in a direction in which the electrode fingers extend. High-acoustic-velocity regions are disposed outside of the intersecting portion in the direction in which the electrode fingers extend. The central region is located at a center in the direction in which the electrode fingers extend. Each of the low-acoustic-velocity regions is a region in which an elastic wave propagation velocity is lower than in the central region. Each of the high-acoustic-velocity regions is a region in which the elastic wave propagation velocity is higher than in the low-acoustic-velocity regions. A portion of each of the low-acoustic-velocity regions differs two-dimensionally or three-dimensionally from a remaining portion of the low-acoustic-velocity region in the elastic-wave propagation direction.

In a particular aspect of an elastic wave device according to a preferred embodiment of the present invention, a portion of each of the low-acoustic-velocity regions differs two-dimensionally from a remaining portion of the low-acoustic-velocity region.

In another particular aspect of an elastic wave device according to a preferred embodiment of the present invention, each of the first and second electrode fingers includes a large-width portion at an end thereof, the large-width portion having a width larger than that of a remaining portion of the electrode finger, and the low-acoustic-velocity regions are defined by the large-width portions.

In a different particular aspect of an elastic wave device according to a preferred embodiment of the present invention, a length of the large-width portion of at least one of the electrode fingers in the direction in which the electrode fingers extend differs from lengths of the large-width portions of remaining electrode fingers in the direction in which the electrode fingers extend.

In still another particular aspect of an elastic wave device according to a preferred embodiment of the present invention, a portion of each of the low-acoustic-velocity regions differs three-dimensionally from a remaining portion of the low-acoustic-velocity region.

In still another particular aspect of an elastic wave device according to a preferred embodiment of the present invention, the low-acoustic-velocity regions are defined by end portions of the first and second electrode fingers stacked on dielectric films.

In still another particular aspect of an elastic wave device according to a preferred embodiment of the present invention, the low-acoustic-velocity regions are defined by mass-addition films stacked on end portions of the first and second electrode fingers.

In still another particular aspect of an elastic wave device according to a preferred embodiment of the present invention, an acoustic velocity in the low-acoustic-velocity regions is made lower than in the central region by a high-acoustic-velocity film, in which an acoustic velocity is higher than in the piezoelectric substrate, stacked on the central region.

In still another particular aspect of an elastic wave device according to a preferred embodiment of the present invention, each of the low-acoustic-velocity regions periodically changes in the elastic-wave propagation direction.

According to still another aspect of a preferred embodiment of the present invention, an electrode finger pitch is uniform in the central region.

According to various preferred embodiments of the present invention, a ladder filter includes a serial arm resonator and a parallel arm resonator. At least one resonator included in the serial arm resonator and the parallel arm resonator is the elastic wave device according to various preferred embodiments of the present invention.

With the elastic wave device according to the present invention, transverse modes can be more effectively suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Figure 1:
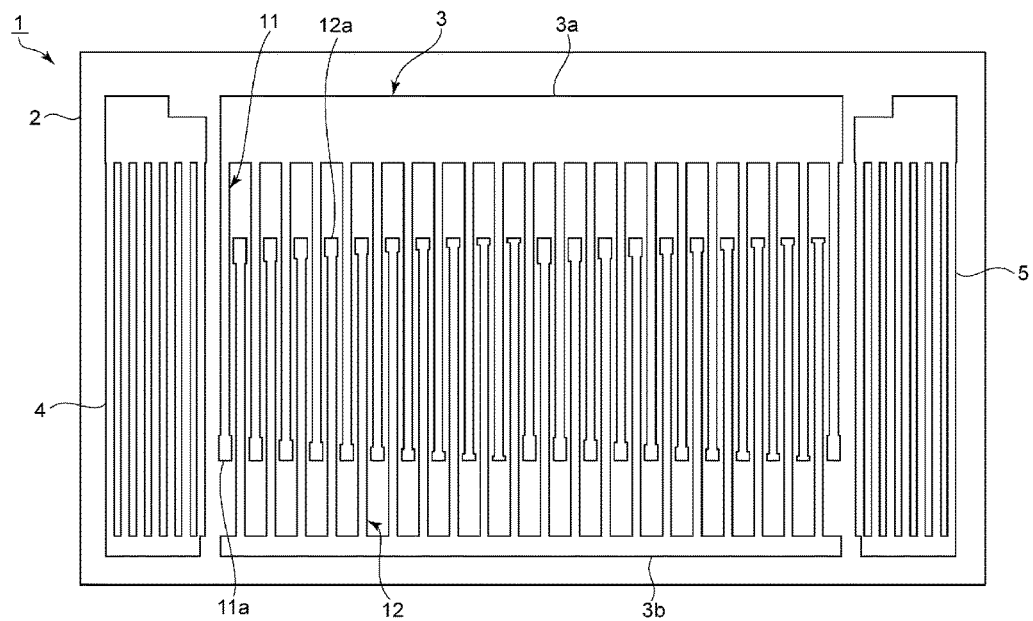
FIG. 1 is a schematic plan view of an elastic wave device according to a first preferred embodiment of the present invention.

FIG. 1 is a schematic plan view of an elastic wave device according to a first preferred embodiment of the present invention.

An elastic wave device 1 includes a piezoelectric substrate 2. The piezoelectric substrate 2 preferably is made from a LiNbO₃ substrate. Instead of LiNbO₃, a piezoelectric material that has a slowness surface as LiNbO₃ does may be used.

An IDT electrode 3 is disposed on the piezoelectric substrate 2. Reflectors 4 and 5 are disposed on both sides of the IDT electrode 3 in the elastic-wave propagation direction. The IDT electrode 3 and the reflectors 4 and 5 are each made of an appropriate metal, such as Pt, Al, or Cu, or an alloy.

In the present preferred embodiment, the IDT electrode 3 and the reflectors 4 and 5 define a one-port surface acoustic wave resonator. In the present preferred embodiment, an SH wave, which is one of elastic waves generated by the IDT electrode 3, is used.

The IDT electrode 3 includes a first busbar 3a and a second busbar 3b disposed separate from the first busbar 3a. The first and second busbars 3a and 3b extend in the elastic-wave propagation direction.

One end of each of a plurality of first electrode fingers 11 is connected to the first busbar 3a. The plurality of first electrode fingers 11 extend toward the second busbar 3b.

One end of each of a plurality of second electrode fingers 12 is connected to the second busbar 3b. The second electrode fingers 12 extend toward the first busbar 3a.

Hereinafter, the directions in which the first and second electrode fingers 11 and 12 extend will be referred to as the "electrode finger direction". On the piezoelectric substrate 2, a direction perpendicular or substantially perpendicular to the electrode finger direction is the elastic-wave propagation direction.

The term "intersecting portion" refers to a region in which the first electrode fingers 11 and the second electrode fingers 12 overlap when seen in the elastic-wave propagation direction. An elastic wave is generated in the intersecting portion.

In the elastic wave device 1, each of the first electrode fingers 11 and each of the second electrode fingers 12 respectively include a large-width portion 11a and a large-width portion 12a at an end thereof. The width of each of the large-width portions 11a and 12a is larger than in the central region of the intersecting portion. That is, the first and second electrode fingers 11 and include the large-width portions 11a and 12a having larger widths than in the central region, and the shapes of the first and second electrode fingers 11 and 12 differ two-dimensionally when the main surface of the piezoelectric substrate 2 is seen in plan view. Here, the term "width" refers to the dimension of each of the first and second electrode fingers 11 and 12 in the direction that is perpendicular to the electrode finger direction.

Thus, the large-width portions 11a are disposed on one side of the central region of the intersecting portion and the large-width portions 12a are disposed on the other side of the central region of the intersecting portion.

In regions in which the large-width portions 11a and 12a are present, the elastic wave propagation velocity is lower than that in the central region. In the large-width portions 11a and 12a of the electrode fingers, the metallization ratio is high, and the elastic wave propagation velocity in the piezoelectric substrate is low. That is, low-acoustic-velocity regions, each of which is similar to that described in WO 2011/088904A1, are disposed on both sides of the central region by forming the large-width portions 11a and 12a. Regions outside of the intersecting portion in the electrode finger direction are high-acoustic-velocity regions. That is, a region between the intersecting portion and the busbar 3a is a high-acoustic-velocity region. In this high-acoustic-velocity region, only the plurality of first electrode fingers 11 are present. On the other hand, in a high-acoustic-velocity region between the intersecting portion and the busbar 3b, only the plurality of second electrode fingers 12 are present. The term "metallization ratio" refers to the ratio of the electrode finger width to the sum of the electrode finger width and the distance between adjacent electrode fingers in the direction perpendicular or substantially perpendicular to the direction in which the electrode fingers extend.

As described above, the low-acoustic-velocity regions are disposed on both sides of the central region in the electrode finger direction in the intersecting portion, and the high-acoustic-velocity regions are disposed outside of the intersecting portion. Accordingly, transverse modes are able to be suppressed or prevented by using a piston mode.

The present preferred embodiment is structured such that the dimension of each of the low-acoustic-velocity regions in the electrode finger direction is not uniform in the elastic-wave propagation direction. To be more specific, in a half of the IDT electrode 3 on the reflector 4 side, the dimension of the large-width portion 11a in the electrode finger direction gradually decreases from the large-width portion 11a of one of the first electrode fingers 11 nearest to the reflector 4 toward the large-width portion 11a of one of the first electrode fingers 11 located in the central region of the IDT electrode 3 in the elastic-wave propagation direction. In a half of the IDT electrode 3 on the reflector 5 side, the dimension of the large-width portion 11a gradually decreases again with increasing distance from the reflector 4. The same applies to the large-width portions 12a, which are provided at ends of the second electrode fingers 12.

Thus, in the IDT electrode 3, the structure, in which the lengths of the large-width portions 11a and 12a decrease with increasing distance from the reflector 4, is repeated twice.

In the elastic wave device 1 according to the present preferred embodiment, the dimensions of the large-width portions 11a and 12a in the electrode finger direction differ in the elastic-wave propagation direction as described above. Accordingly, the dimension of each of the low-acoustic-velocity regions on both sides of the central region in the electrode finger direction changes in the elastic-wave propagation direction. Therefore, transverse-mode ripples are further effectively suppressed or prevented. It is considered that transverse modes are effectively diffused because the large-width portions 11a and 12a at the ends of the electrode fingers 11 and 12 generate non-uniform elastic waves. Therefore, it is possible to effectively suppress or prevent transverse modes by using a piston mode.

Figure 2:
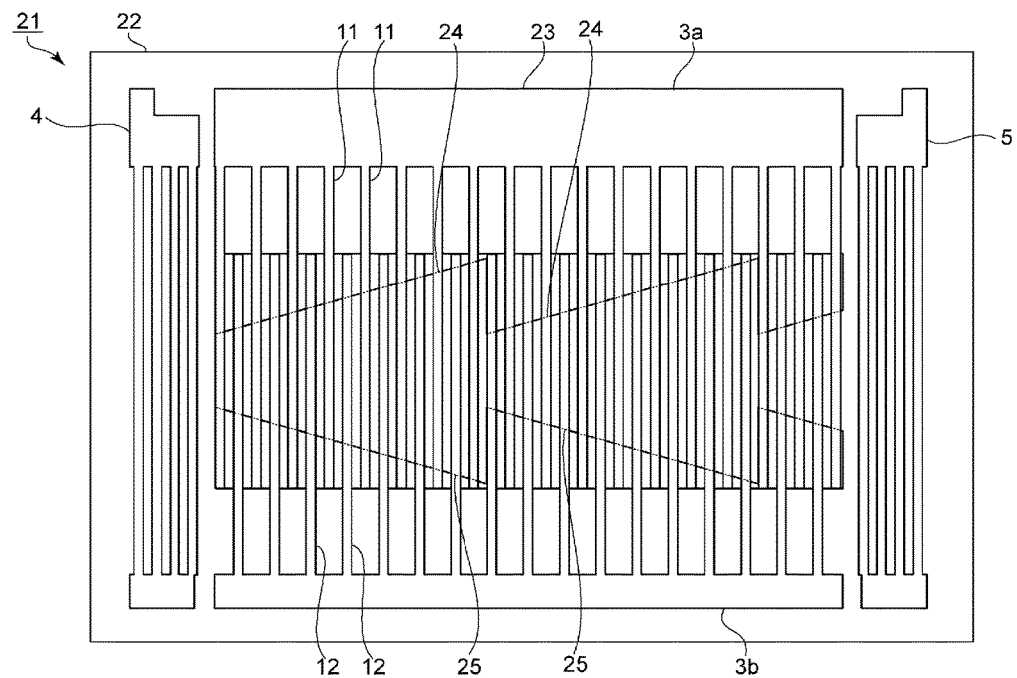
FIG. 2 is a schematic plan view of an elastic wave device according to a second preferred embodiment of the present invention.

FIG. 2 is a schematic plan view of an elastic wave device according to a second preferred embodiment of the present invention. In an elastic wave device 21, an IDT electrode 23 and reflectors 4 and 5 are disposed on a piezoelectric substrate 22.

The second preferred embodiment differs from the first preferred embodiment in the structure for forming low-acoustic-velocity regions. That is, the plurality of first electrode fingers 11 and the plurality of second electrode fingers 12 do not have large-width portions at ends thereof. Instead, at end portions of the plurality of first electrode fingers 11 and the plurality of second electrode fingers 12, dielectric films 24 and 25 are disposed below the first and second electrode fingers 11 and 12. That is, the end portions of the first electrode fingers 11 are stacked on the dielectric film 25. As the dielectric film 25, a dielectric film having a function of appropriately reducing the acoustic velocity, such as a SiO$_2$ film, is able to be used.

A region in which the first electrode fingers 11 are stacked on the dielectric film 25 is a low-acoustic-velocity region. Likewise, a region in which the second electrode fingers 12 are stacked on the dielectric film 24 is a low-acoustic-velocity region. The dimension of each of the dielectric films 24 and 25 in the electrode finger direction gradually decreases from one of the first electrode fingers 11 nearest to the reflector 4 with increasing distance from the reflector 4. In the present preferred embodiment, the structure, in which the dimension of each of the dielectric films 24 and 25 in the electrode finger direction gradually decreases, is repeated for about 2.3 cycles, for example.

Also in the present preferred embodiment, the dimension of each of the low-acoustic-velocity regions in the electrode finger direction is not uniform in the elastic-wave propagation direction but is changed as described above. Therefore, as with the first preferred embodiment, transverse modes are able to be effectively suppressed or prevented.

Figure 3:
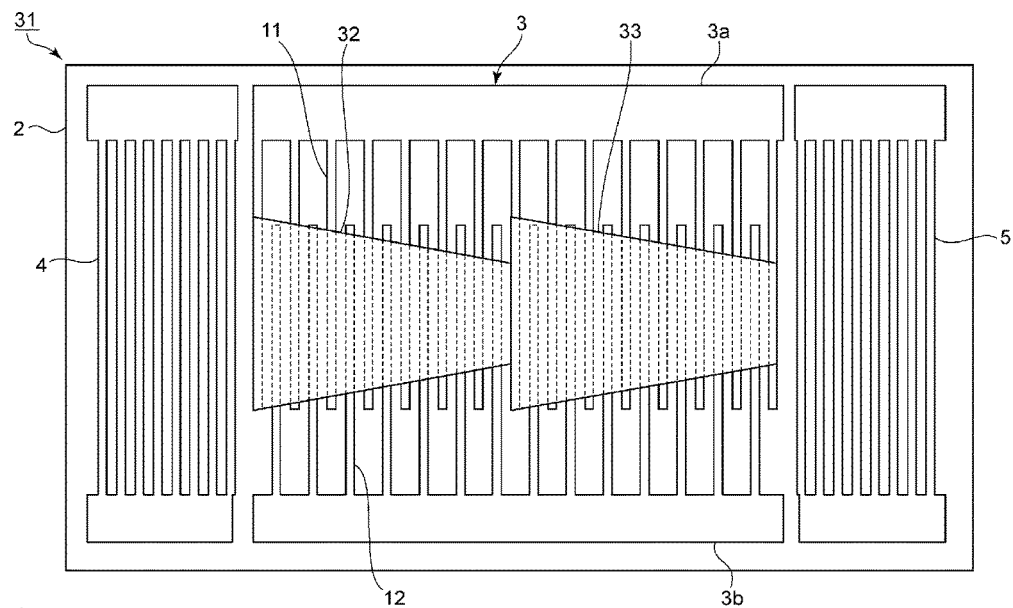
FIG. 3 is a schematic plan view of an elastic wave device according to a third preferred embodiment of the present invention.

FIG. 3 is a schematic plan view of an elastic wave device according to a third preferred embodiment of the present invention. In an elastic wave device 31 according to the third preferred embodiment, dielectric films 32 and 33, in which the acoustic velocity is higher than that in the piezoelectric substrate 2, are stacked on first and second electrode finger 11 and 12 in a central region in the electrode finger direction. As the dielectric films 32 and 33, appropriate high-acoustic-velocity dielectric films, such as SiN or AlN films, are able to be used.

In a portion of the intersecting portion in which the dielectric films 32 and 33 are stacked, the acoustic velocity is increased. In the intersecting portion, low-acoustic-velocity regions are disposed on both sides of the dielectric films 32 and 33. The dimension of the dielectric film 32 in the electrode finger direction gradually decreases from a portion on the IDT electrode 3 near the reflector 4 toward the center of the IDT electrode 3. Accordingly, the dimension, in the electrode finger direction, of the high-acoustic-velocity region in the central region gradually decreases from a portion of the IDT electrode 3 nearest to the reflector 4 toward the center of the IDT electrode 3. Therefore, the dimension of each of the low-acoustic-velocity regions, in which the acoustic velocity is comparatively low, on both sides of the dielectric films 32 in the electrode finger direction gradually increases with increasing distance from the reflector 4. Likewise, the dielectric film 33 is disposed in a part of the IDT electrode 3 from the center of the IDT electrode 3 toward the reflector 5, and the dimension of each of the low-acoustic-velocity regions in the electrode finger direction gradually increases toward the reflector 5.

As described above, in the intersecting portion, the dimension of each of the low-acoustic-velocity regions in the electrode finger direction may be changed in the elastic-wave propagation direction by changing the dimension of the central region, in which the acoustic velocity is higher than that in the low-acoustic-velocity regions, in the electrode finger direction. Also in the present preferred embodiment, the dimension of each of the low-acoustic-velocity regions in the electrode finger direction is not uniform in the elastic-wave propagation direction. Therefore, transverse modes are able to be effectively suppressed or prevented.

Figure 4:
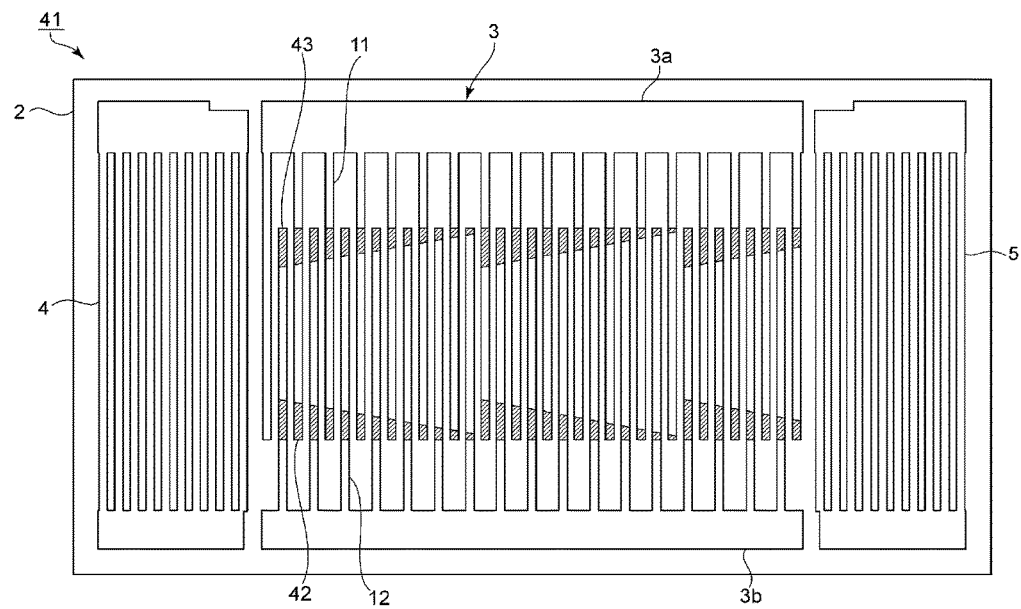
FIG. 4 is a schematic plan view of an elastic wave device according to a fourth preferred embodiment of the present invention.

FIG. 4 is a schematic plan view of an elastic wave device according to a fourth preferred embodiment of the present invention. In an elastic wave device 41, mass-addition films 42 and 43 are stacked on end portions of first electrode fingers 11 and second electrode fingers 12 of an IDT electrode 3. The mass-addition films 42 and 43 are able to be made of a metal or the like that is heavier than the first and second electrode fingers 11 and 12.

The acoustic velocity is reduced in regions in which the mass-addition films 42 and 43 are disposed. Accordingly, in the intersecting portion, low-acoustic-velocity regions are disposed on both sides of the central region by disposing the mass-addition films 42 and 43.

In the present preferred embodiment, the structure, in which the dimension of the mass-addition films 42 and 43 in the electrode finger direction gradually decreases from one of the electrode fingers near the reflector 4 with increasing distance from the reflector 4, is repeated for about 2.7 cycles.

Accordingly, also in the present preferred embodiment, each of the low-acoustic-velocity regions is not uniform in the elastic-wave propagation direction. Therefore, transverse modes are able to be effectively suppressed or prevented.

As can be seen from the second to fourth preferred embodiments of the present invention described above, the structure for defining low-acoustic-velocity regions are able to be modified as appropriate. The structure in which each of the low-acoustic-velocity regions changes in the elastic-wave propagation direction may be repeated for a plurality of cycles and is not particularly limited.

FIGS. 5 to 8 are simplified plan views illustrating other preferred embodiments of the present invention. In FIGS. 5 to 8, the boundaries between a central region and low-acoustic-velocity regions are shown by solid lines A and B in order to illustrate modifications of the number of repeats and the patterns of the low-acoustic-velocity regions. A region between the solid line A and the solid line B is a central region C. A region between the solid line A and a solid straight line D, which is outside of the solid line A, and a region between the solid line B and a solid straight line E, which is outside of the solid line B, are low-acoustic-velocity regions L1 and L2. A region between the solid line D and the solid line E is an intersecting portion. Regions outside of the solid line D and the solid line E are high-acoustic-velocity regions H1 and H2.

Figure 5:
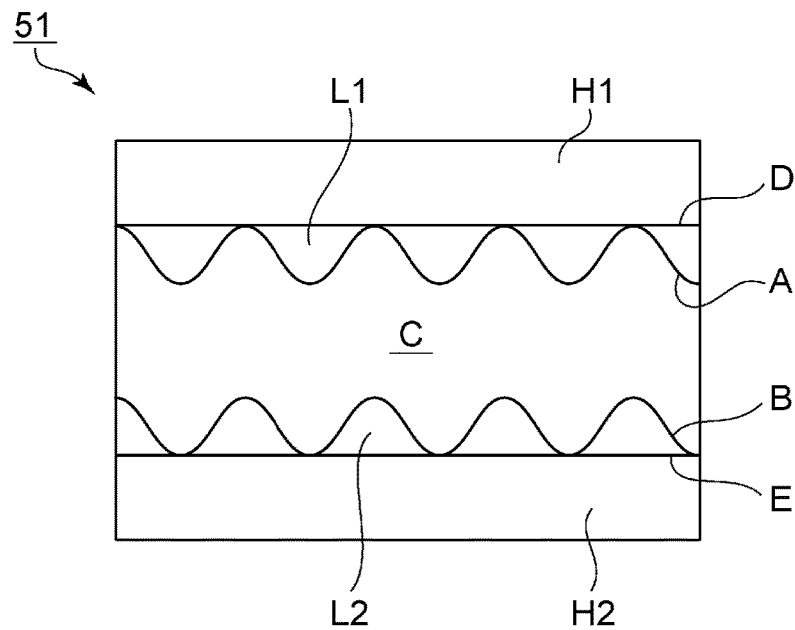
FIG. 5 is a simplified plan view of an elastic wave device according to a fifth preferred embodiment of the present invention.

FIG. 5 illustrates an elastic wave device 51 according to a fifth preferred embodiment, in which the dimension of each of the low-acoustic-velocity regions L1 and L2 in the electrode finger direction is repeatedly changed in the elastic-wave propagation direction. Here, the solid line A and the solid line B change in curved shapes.

Figure 6:
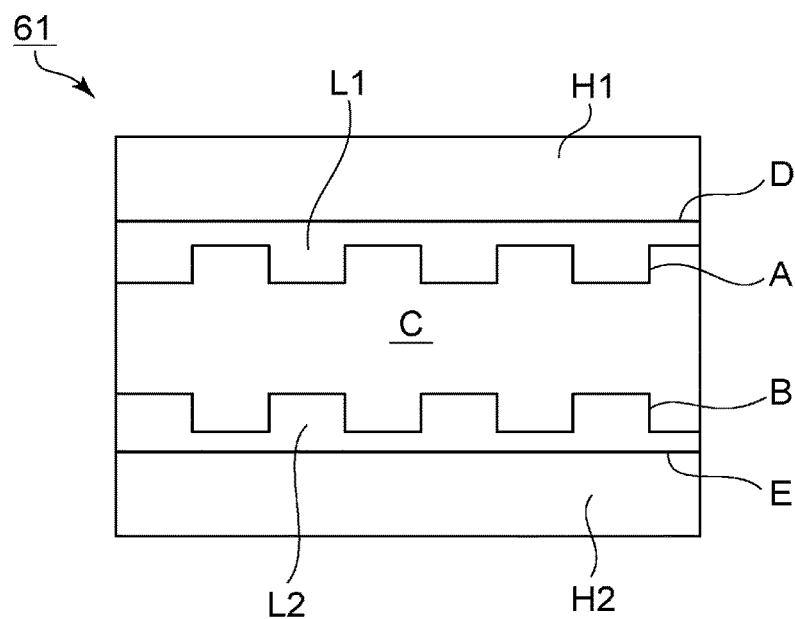
FIG. 6 is a simplified plan view of an elastic wave device according to a sixth preferred embodiment of the present invention.

FIG. 6 illustrates an elastic wave device 61 according to a sixth preferred embodiment of the present invention, in which the solid line A and the solid line B are shaped like square waves.

Figure 7:
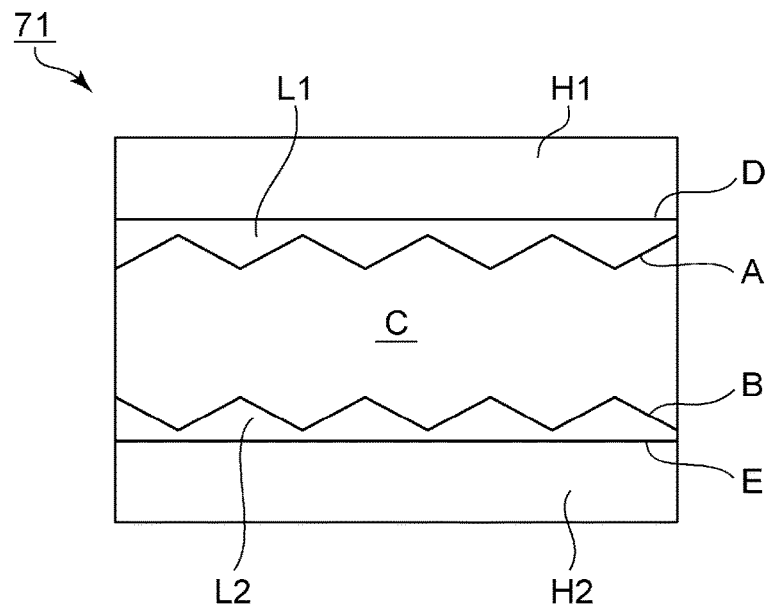
FIG. 7 is a simplified plan view of an elastic wave device according to a seventh preferred embodiment of the present invention.

FIG. 7 illustrates an elastic wave device 71 according to a seventh preferred embodiment of the present invention, in which the solid line A and the solid line B are shaped like triangle waves.

As illustrated in FIGS. 5 to 7, the method of changing the dimension of each of the low-acoustic-velocity regions L1 and L2 in the electrode finger direction may be modified in various ways and is not particularly limited.

Figure 8:
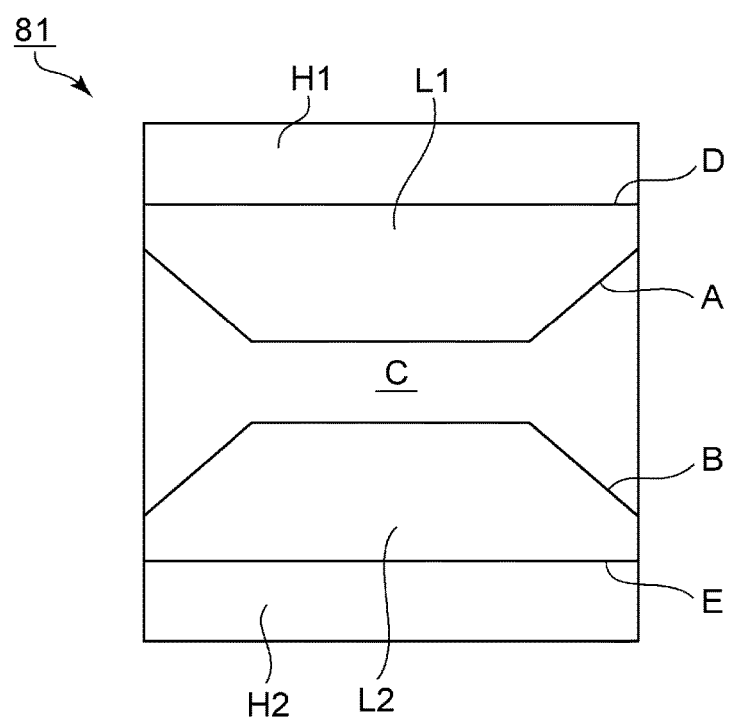
FIG. 8 is a simplified plan view of an elastic wave device according to an eighth preferred embodiment of the present invention.

FIG. 8 illustrates an elastic wave device 81 according to an eighth preferred embodiment of the present invention. As in this preferred embodiment, the solid line A and the solid line B may be partially parallel a line extending in the elastic-wave propagation direction. That is, each of the low-acoustic-velocity regions L1 and L2 may include a portion whose dimension in the electrode finger direction is uniform in the elastic-wave propagation direction. Also in this case, in regions near both ends of the IDT electrode in the elastic-wave propagation direction, the dimension of each of the low-acoustic-velocity regions L1 and L2 in the electrode finger direction changes in the elastic-wave propagation direction. Accordingly, as with the first to seventh preferred embodiments of the present invention, transverse mode ripples are able to be effectively suppressed or prevented.

Next, a non-limiting experimental example will be described.

Figure 9:
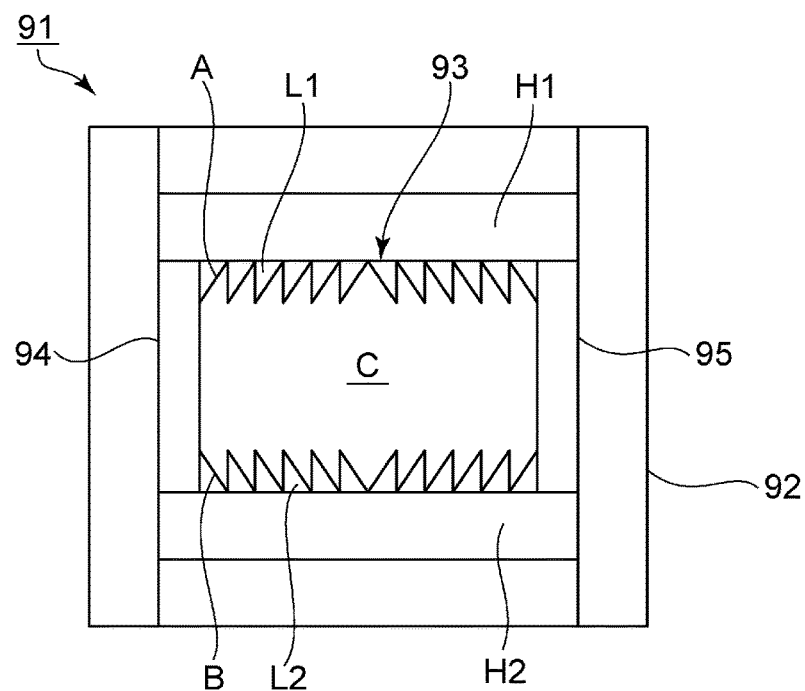
FIG. 9 is a simplified plan view of an elastic wave device according to an experimental example as a ninth preferred embodiment of the present invention.

FIG. 9 is a simplified plan view of an elastic wave device 91 prepared as the experimental example. In the elastic wave device 91, an IDT electrode 93 and reflectors 94 and 95 were formed on a piezoelectric substrate 92, which was made of LiNbO$_3$. The number of pairs of electrode fingers in the IDT electrode 93 was 160.5. The number of pairs of electrode fingers in each of the reflectors 94 and 95 was 14.5. The electrode finger pitch in the IDT electrode 93 was 3.8 μm.

The IDT electrode 93 had a repeating pattern of portions in each of which the dimension of the low-acoustic-velocity regions L1 and L2 in the electrode finger direction changed as shown by the solid line A and the solid line B. Each of the portions, in which the dimension of the low-acoustic-velocity region L1 in the electrode finger direction changed from the maximum to the minimum, was defined as one "set". In one set, for 321 electrode fingers, the dimensions of the electrode fingers in the low-acoustic-velocity region were reduced from 0.9λ to 0.8λ in length. In FIG. 9, twelve sets, in each of which the low-acoustic-velocity region change, are disposed from one end toward the other end of the IDT electrode 93 in the elastic-wave propagation direction.

Figure 10:
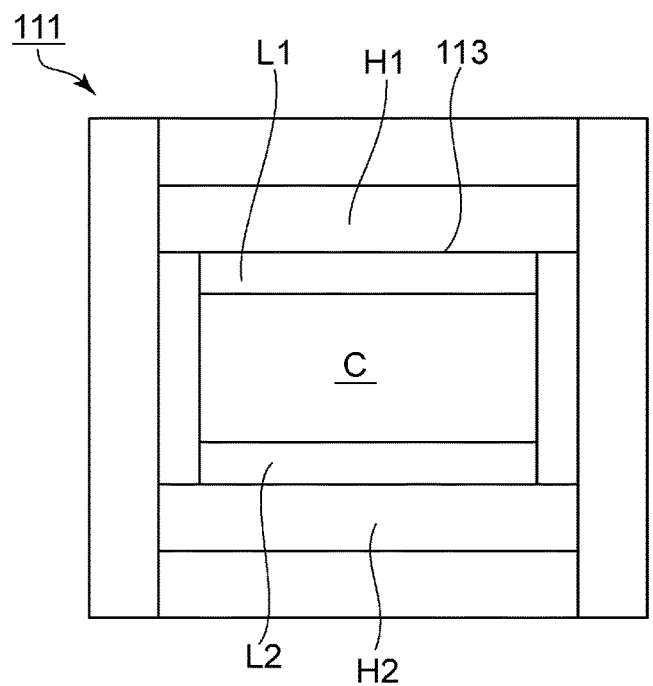
FIG. 10 is a schematic plan view of an elastic wave device according to a comparative example.

For comparison, an elastic wave device 111 according to a comparative example, illustrated in FIG. 10, was prepared. In the elastic wave device 111 according to the comparative example, the dimension of each of low-acoustic-velocity regions in the electrode finger direction was uniform at 0.99λ in an IDT electrode 113. In other respects, the elastic wave device 111 was the same as the elastic wave device 91.

Figure 11:
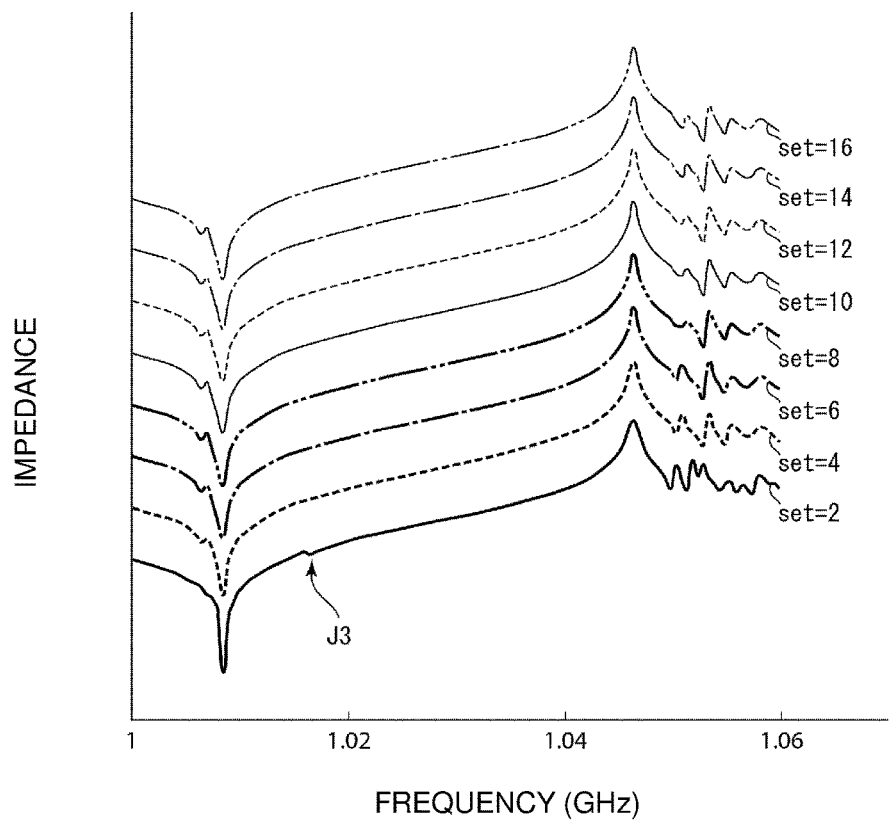
FIG. 11 is a graph representing the relationship between the number of repeats and the resonance characteristics in a case where a structure in which low-acoustic-velocity regions change in the elastic-wave propagation direction is repeated.

FIG. 11 is a graph representing the resonance characteristics of the elastic wave device 91 in the cases where the numbers of sets were 2, 4, 6, 8, 10, 12, 14 and 16. In order to facilitate comparison between the resonance characteristics for different numbers of sets, FIG. 11 is illustrated so that the resonance characteristics are displaced from each other in the vertical-axis direction.

Figure 12:
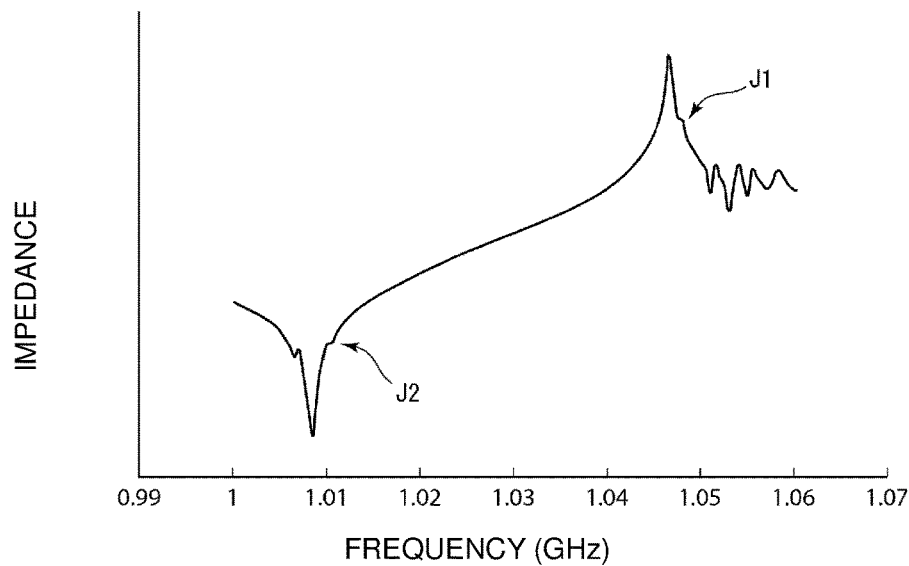
FIG. 12 is a graph representing the resonance characteristics of the elastic wave device according to the comparative example shown in FIG. 10.

FIG. 12 is a graph representing the resonance characteristics of the comparative example shown in FIG. 10. As can be seen from FIG. 12, transverse-mode ripples occurred as shown by arrows J1 and J2.

In contrast, in the present experimental example, as can be seen from FIG. 11, as the number of sets increased from 2 to 16, the transverse mode ripples were effectively suppressed. It can be also seen that, even when the number of sets was 2, a transverse mode ripple shown by the arrow J1 in FIG. 12 was eliminated; and a transverse mode ripple shown by the arrow J2 in FIG. 12 was made smaller as shown by an arrow J3.

It can be seen that, when the number of sets was 4 or more, the transverse mode ripple shown by the arrow J3 was also suppressed. It is considered that this is due to the structure described above, in which the dimension of each of the low-acoustic-velocity regions in the electrode finger direction is not uniform in the elastic-wave propagation direction. That is, it is considered that transverse modes were diffused and transverse-mode ripples were effectively suppressed.

Figure 13:
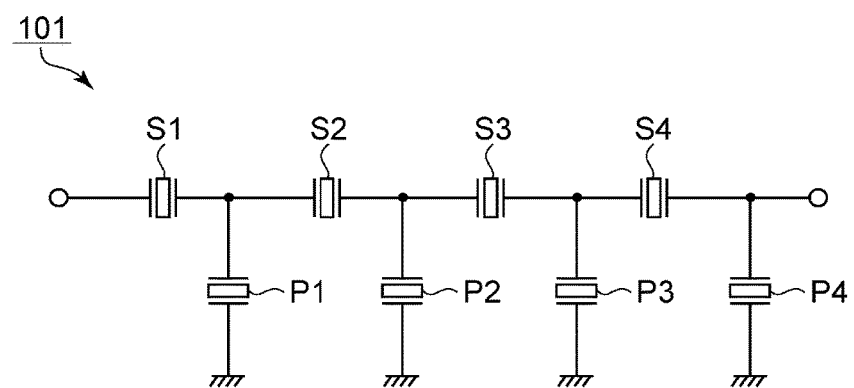
FIG. 13 is a circuit diagram of an example of a ladder filter to which various preferred embodiments of the present invention are able to be applied.

Elastic wave devices according to various preferred embodiments of the present invention are able to be used in various elastic wave resonators and various elastic wave filters. For example, elastic wave devices according to various preferred embodiments of the present invention can be appropriately used as at least one of serial arm resonators S1 to S4 and parallel arm resonators P1 to P4 of a ladder filter 101 illustrated in FIG. 13. Thus, the filter characteristics are significantly improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a piezoelectric substrate; and
an interdigital transducer (IDT) electrode disposed on the piezoelectric substrate; wherein
the IDT electrode includes a plurality of first electrode fingers and a plurality of second electrode fingers that interdigitate with each other;

in an intersecting portion including a region in which the first electrode fingers and the second electrode fingers overlap in an elastic-wave propagation direction, low-acoustic-velocity regions are disposed on both sides of a central region in a direction in which the first and second electrode fingers extend, and high-acoustic-velocity regions are disposed outside of the intersecting portion in the direction in which the first and second electrode fingers extend, the central region being located at a center in the direction in which the first and second electrode fingers extend, each of the low-acoustic-velocity regions being a region in which an elastic wave propagation velocity is lower than in the central region, each of the high-acoustic-velocity regions being a region in which the elastic wave propagation velocity is higher than in the low-acoustic-velocity regions;

a portion of each of the low-acoustic-velocity regions differs two-dimensionally or three-dimensionally from a remaining portion of the respective low-acoustic-velocity region in the elastic-wave propagation direction; and the low-acoustic-velocity regions include a repeating pattern structure wherein, in each repeating pattern, a dimension of each of the low-acoustic-velocity regions in the direction in which the first and second electrode fingers extend increases or decreases in the elastic-wave propagation direction.

2. The elastic wave device according to claim 1, wherein a portion of each of the low-acoustic-velocity regions differs two-dimensionally from a remaining portion of the respective low-acoustic-velocity region.

3. The elastic wave device according to claim 2, wherein each of the first and second electrode fingers includes a large-width portion at an end thereof, the large-width portion having a width larger than that of a remaining portion of the respective one of the first and second electrode fingers, and the low-acoustic-velocity regions are defined by the large-width portions.

4. The elastic wave device according to claim 3, wherein a length of the large-width portion of at least one of the first and second electrode fingers in the direction in which the first and second electrode fingers extend differs from lengths of the large-width portions of remaining ones of the first and second electrode fingers in the direction in which the first and second electrode fingers extend.

5. The elastic wave device according to claim 1, wherein a portion of each of the low-acoustic-velocity regions differs three-dimensionally from a remaining portion of the respective low-acoustic-velocity region.

6. The elastic wave device according to claim 5, wherein the low-acoustic-velocity regions include end portions of the first and second electrode fingers stacked on dielectric films.

7. The elastic wave device according to claim 5, wherein the low-acoustic-velocity regions include mass-addition films stacked on end portions of the first and second electrode fingers.

8. The elastic wave device according to claim 5, wherein an acoustic velocity in the low-acoustic-velocity regions is lower than in the central region due to a high-acoustic-velocity film, in which an acoustic velocity is higher than in the piezoelectric substrate, located on the central region.

9. The elastic wave device according to claim 1, wherein each of the low-acoustic-velocity regions periodically changes in the elastic-wave propagation direction.

10. The elastic wave device according to claim 1, wherein an electrode finger pitch is uniform in the central region.

11. A ladder filter comprising:
a serial arm resonator; and
a parallel arm resonator; wherein
at least one resonator included in the serial arm resonator and the parallel arm resonator is the elastic wave device according to claim 1.

12. The ladder filter according to claim 11, wherein a portion of each of the low-acoustic-velocity regions differs two-dimensionally from a remaining portion of respective the low-acoustic-velocity region.

13. The ladder filter according to claim 12, wherein each of the first and second electrode fingers includes a large-width portion at an end thereof, the large-width portion having a width larger than that of a remaining portion of the respective one of the first and second electrode fingers, and the low-acoustic-velocity regions are defined by the large-width portions.

14. The ladder filter according to claim 13, wherein a length of the large-width portion of at least one of the first and second electrode fingers in the direction in which the first and second electrode fingers extend differs from lengths of the large-width portions of remaining ones of the first and second electrode fingers in the direction in which the first and second electrode fingers extend.

15. The ladder filter according to claim 11, wherein a portion of each of the low-acoustic-velocity regions differs three-dimensionally from a remaining portion of the respective low-acoustic-velocity region.

16. The ladder filter according to claim 15, wherein the low-acoustic-velocity regions include end portions of the first and second electrode fingers stacked on dielectric films.

17. The ladder filter according to claim 15, wherein the low-acoustic-velocity regions include mass-addition films stacked on end portions of the first and second electrode fingers.

18. The ladder filter according to claim 15, wherein an acoustic velocity in the low-acoustic-velocity regions is lower than in the central region due to a high-acoustic-velocity film, in which an acoustic velocity is higher than in the piezoelectric substrate, located on the central region.

19. The ladder filter according to claim 11, wherein each of the low-acoustic-velocity regions periodically changes in the elastic-wave propagation direction.

20. The ladder filter according to claim 11, wherein an electrode finger pitch is uniform in the central region.

* * * * *